United States Patent
Byrn et al.

(10) Patent No.: US 6,910,201 B2
(45) Date of Patent: Jun. 21, 2005

(54) CUSTOM CLOCK INTERCONNECTS ON A STANDARDIZED SILICON PLATFORM

(75) Inventors: Jonathan William Byrn, Kasson, MN (US); James Arnold Jensen, Eagan, MN (US); Matthew Scott Wingren, Rochester, MN (US)

(73) Assignee: LSI Logic Corporation, Milpitas, CA (US)

( * ) Notice: Subject to any disclaimer, the term of this patent is extended or adjusted under 35 U.S.C. 154(b) by 100 days.

(21) Appl. No.: 10/664,137

(22) Filed: Sep. 17, 2003

(65) Prior Publication Data

US 2005/0062495 A1 Mar. 24, 2005

(51) Int. Cl.$^7$ .......................... G06F 17/50; H01L 27/10
(52) U.S. Cl. ........................................ 716/17; 257/204
(58) Field of Search ............................... 716/7, 10, 12, 716/13, 14, 16, 17; 257/202, 204–211

(56) References Cited

U.S. PATENT DOCUMENTS 6,552,410 B1 * 4/2003 Eaton et al. ................ 257/530

OTHER PUBLICATIONS

Rapid Chip™ Technology, "Fast Custom Silicon through Platform–Based Design" of LSI Logic, Copyright 2002, dated Apr. 2003, pp. 1–14.

Rapid Chip, "platforms," "New family of RapidChip Foundation Slices" of LSI Logic, May 1, 2003, website pp. 1 and 2.
Rapid Chip, "Semiconductor Platform," copyright 2002 by LSI Logic Corporation, 4 pages.
Rapid Chip, "platforms," "RapidChip frequently asked questions" of LSI Logic, May 1, 2003, website pp. 1 and 2.
Rapid Chip, "platforms," "Redefining the way chips are made" of LSI Logic, May 1, 2003, website pp. 1 and 2.
Rapid Chip, "Fast facts" of LSI Logic, May 1, 2003, website p. 1.

* cited by examiner

Primary Examiner—Evan Pert
(74) Attorney, Agent, or Firm—Westman, Champlin & Kelly

(57) ABSTRACT

A standardized silicon platform chip has a substrate surface with an array of unconnected transistors that surround islands. The islands have circuit elements that are interconnectable within each island to form a plurality of varied circuit functions for each of the islands. The varied circuit functions include both application functions and clock functions. Interconnect layers are deposited over the substrate surface to interconnect the circuit elements within each island to complete the varied circuit functions. The varied circuit functions include varied levels of integration including at least gates, flip-flops, clock trees, and oscillators. The varied circuit functions are custom connectable to the array of unconnected transistors to form standard clock resources for the standardized silicon platform chip.

18 Claims, 4 Drawing Sheets

CUSTOM CLOCK INTERCONNECTS ON A STANDARDIZED SILICON PLATFORM

FIELD OF THE INVENTION

The present invention relates to integrated circuits. In particular, the present invention relates to generation of clocks and resets in silicon platform chips.

BACKGROUND OF THE INVENTION

In design processes for very large scale integration (VLSI) integrated circuit chips, standard features and custom features can be combined to produce a completed design. The balance between use of standard and custom features is a difficult one that affects design costs, risks and time-to-market schedules and is often based on market forces that set performance requirements, unit costs, volume and design life for the finished integrated chip.

As illustrated in FIG. 1, different design process technologies lead to different mixes of time-to-market and performance. In FIG. 1, a vertical axis 100 represents relative performance in terms of speed and complexity of the functions performed by a chip. A horizontal axis 102 represents relative time lengths of the design process for the chip.

A technology known as field programmable gate array (FPGA) typically produces designs indicated at 104 with ranges of relatively low performance, and medium time-to-market. With FPGA technology, an integrated circuit manufacturer places fixed gates in fixed patterns on chips and provides a fixed but "programmable" array of interconnects. The customer can then alter the interconnects on each chip, typically by damaging an interconnect with an overcurrent, to customize each gate array chip for a particular application. Because the "building blocks" for this technology are system gates or other medium scale logic elements, the complexity that can be achieved is limited.

A technology known as application specific integrated circuitry (ASIC) typically produces designs indicated at 106 with ranges of relatively high performance and high time-to-market. With ASIC, an integrated circuit manufacturer provides a library of low to medium complexity cells such as logic gates, counters and latches. The integrated circuit manufacturer also provides or specifies software tools so that a customer can design, simulate and time the customer's circuit. This logical representation is translated into a custom layout and custom interconnect of library and sometimes custom integrated circuits. Once the customer's design is complete, then the integrated circuit manufacturer uses the customer's design to manufacture custom chips with a custom interconnect pattern and also custom cell patterns. The design process is long because of the ever-increasing complexity associated with the open-ended nature of this process.

A design process known as application specific standard product (ASSP) typically produces designs indicated at 108 with ranges of relatively medium performance and low time-to-market. With ASSP, an integrated circuit manufacturer completes the design process for a chip (in much the same manner that a customer would complete a design process for an ASIC). Once the design is complete, then the integrated circuit manufacturer uses the design to make standard chips that are typically sold to multiple customers with similar needs, typically in a particular application niche. The use by multiple customers increases the volume and allows for a larger investment in the design process.

A more recent design process referred to here as a "standardized silicon platform" has a capability to produce designs indicated at 110 with ranges of performance and time-to-market that are comparable to FPGA, ASSP and ASIC, and also has a capability to produced designs in ranges outside of range of capabilities of FPGA, ASSP and ASIC. With standardized silicon platform technology, the manufacturer provides a partially manufactured very large scale integration (VLSI) standard integrated circuit that includes standard slices that are designed to perform complex, high level functions, but which have not had all of their associated interconnect layers completed. The integrated circuit manufacturer provides or specifies software design tools that enable a customer to integrate and customize these complex high level functions, thereby providing a very high level, fast design tool. The customer can also add in the customer's customized circuitry on the same chip. Once the customer's design is complete, the completed chip can be much more quickly produced since a significant portion of the problem is already solved. The time needed to integrate and customize the standardized silicon platform is small in comparison to ASIC technology. High relative levels of performance can be achieved with standardized silicon platform technology.

Within the entire design space, one area that can cause great difficulty across the spectrum of design activities is the generation, management, qualification and testing of clocking and reset circuitry. The standardized silicon platform technology includes the use of clocking and reset circuitry. Clock and reset circuitry is used to generate synchronized clock signals to meet the customer's specification for speed, sequencing, skew and other parameters. It is found however, that in many cases the clock and reset circuitry is done in a way that is not compatible with the capabilities of the design systems available. There are many ways to create and manage these circuits poorly. As a result, they are often not able to meet complex clocking requirements that are unique to each customer's application. In addition, if these circuits are designed outside the capabilities of the design system, severe delays can be and are encountered in the overall development of the circuit. Implementation of complex "ad hoc" clock and reset circuitry is often difficult to test using EDA tools, slows down the circuit design process, and introduces considerable technical risk into the performance of the chip. The "ad hoc" circuitry is difficult to test using standard manufacturing test software tools, leaving potential open loop timing closure problems in the design.

A method and apparatus are needed that provide an increased level of standard clock and reset functionality and that reduce or eliminate the need for "ad hoc" customer circuitry for producing clocks that meet customer specifications.

SUMMARY OF THE INVENTION

Disclosed are a standardized silicon platform chip and methods for design of such chips. The standardized silicon platform chip comprises a substrate having a substrate surface that includes an array of unconnected transistors that surround a plurality of islands. The plurality of islands include circuit elements that are interconnectable within each island to form a plurality of varied circuit functions for each of the islands. The varied circuit functions include both application functions and clock functions.

The standardized silicon platform chip also comprises a plurality of interconnect layers deposited over the substrate surface. The interconnect layers interconnect the circuit elements within each island to complete the plurality of varied circuit functions.

The varied circuit functions include varied levels of integration including at least gates, flip-flops, clock trees, and oscillators. The varied circuit functions are custom connectable to the array of unconnected transistors to form standard clock resources for the standardized silicon platform chip.

In a preferred embodiment, a second plurality of interconnections the circuit elements on the islands and the array of unconnected transistors to form known good clock functions. The known good clock functions are selected from a group of clock functions that are known to provide superior performance in manufacturing test, timing closure, clocking functionality and other factors that impact time to complete a detailed design and manufacture of a standardized silicon platform integrated circuit.

Other features and benefits that characterize embodiments of the present invention will be apparent upon reading the following detailed description and review of the associated drawings.

DETAILED DESCRIPTION OF THE PREFERRED EMBODIMENTS

In the embodiments described below in FIGS. 2–4, a standardized silicon platform design technology is enhanced to include a method and apparatus for the creation of clocking and reset circuits with clock resources such as standard clock factories, standard oscillator sources and standard reset sources. Using a software design tool, the user can customize the clock resources to adapt them to the needs of a custom chip design specification. The use of complex, time consuming, risky add-ons of "ad hoc" circuitry is avoided. Once the custom design is quickly completed using the method and apparatus as expressed in a software design tool, this step of the chip is completed and ready to be passed on for design completion at the manufacturer.

Figure 1:
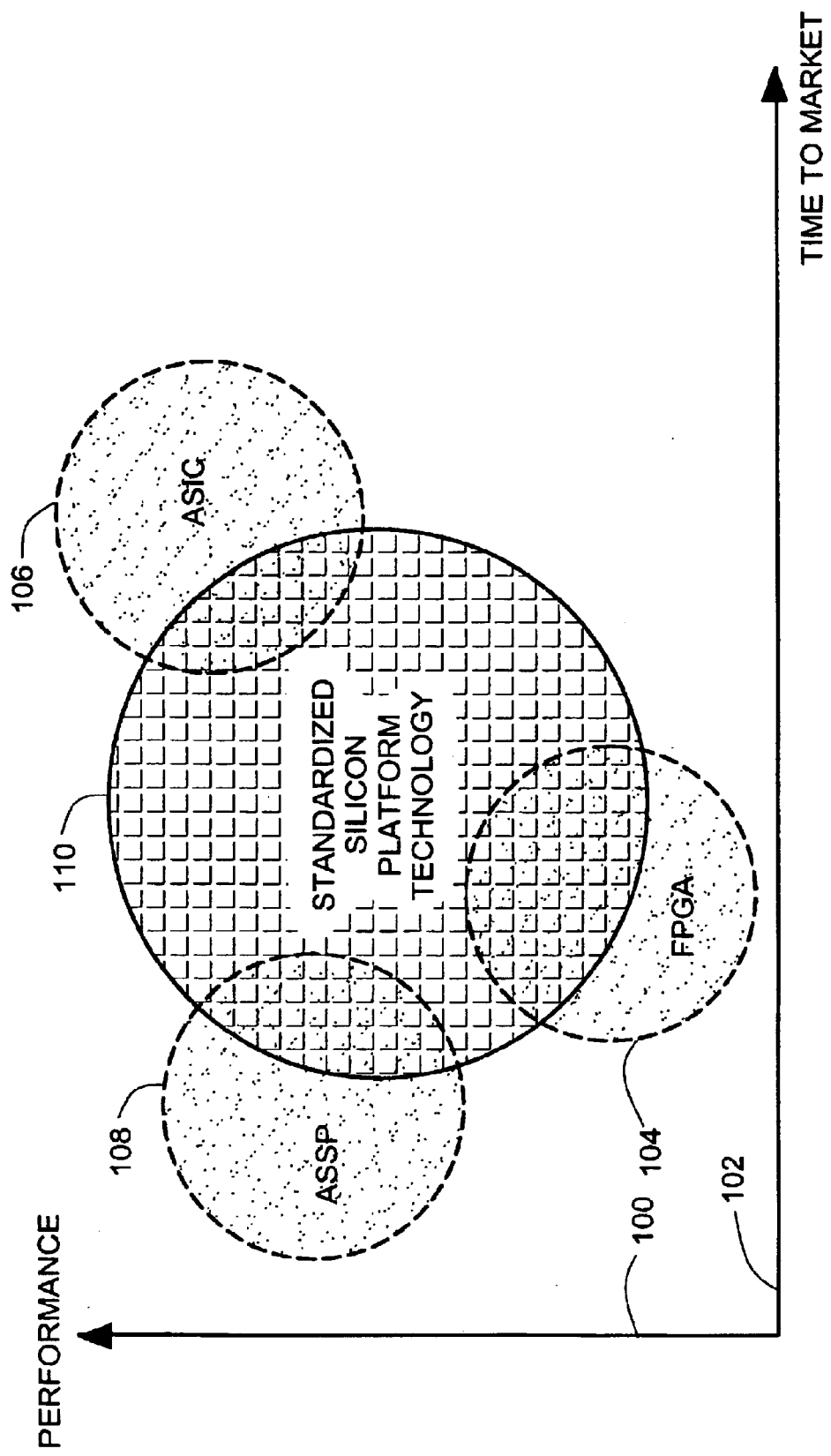
FIG. 1 illustrates a graph of relative performance as a function of time-to-market for different integrated circuit technologies.

FIG. 1 (discussed above in the background of the invention) defines the "standardized silicon platform technology" in a context of older technologies such as FPGA, ASIC and ASSP, which it can supplant. Standardized silicon platform technology includes the use of a silicon chip which has islands of circuit functions surrounded by an array of unconnected transistors that can be interconnected to form custom application functions. As described below in connection with FIGS. 2A, 2B, 2C, 3, 4, the standardized silicon platform technology is extended to include standardized clock and reset designs that can be customized by addition of custom interconnect layers.

Figure 2B:
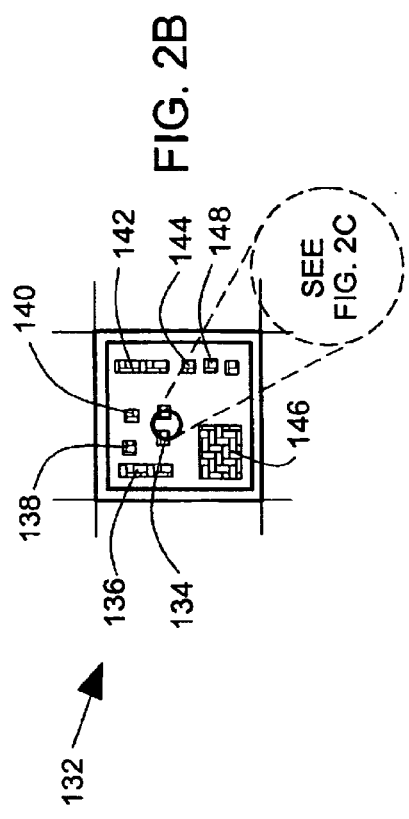
FIG. 2B illustrates an enlarged view of an exemplary chip in the array illustrated in FIG. 2A.
Figure 2C:
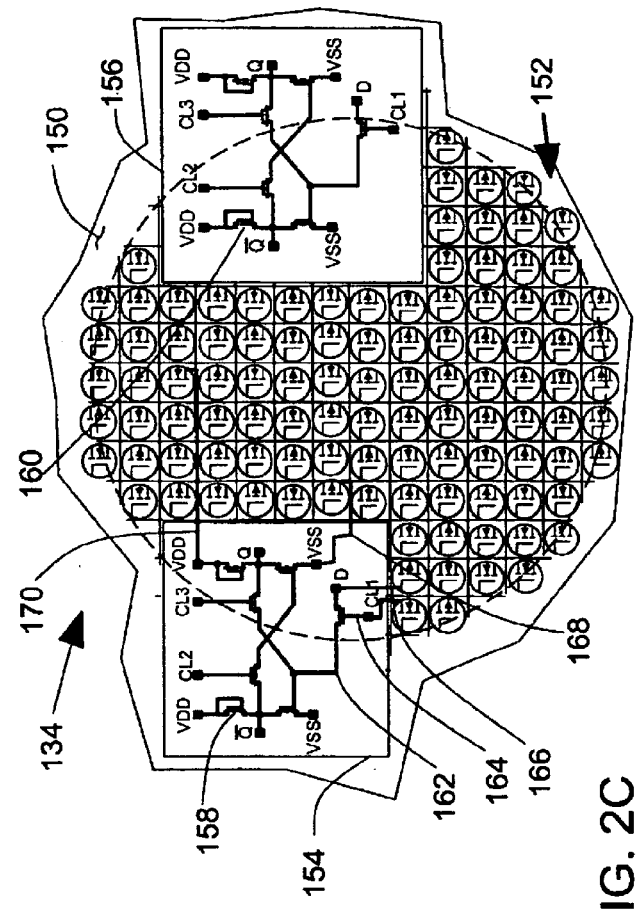
FIG. 2C illustrates an enlarged view of a small portion of the chip illustrated in FIG. 2B.
Figure 2A:
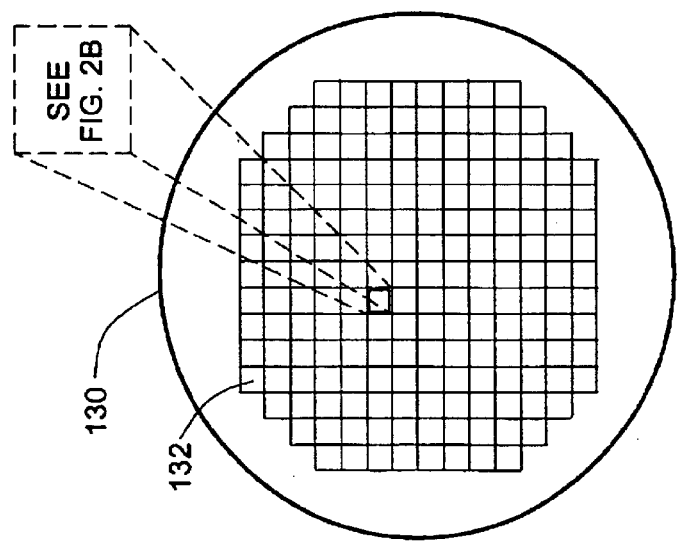
FIG. 2A illustrates a silicon wafer including an array of standardized silicon platform chips.

FIGS. 2A, 2B, 2C illustrate a standardized silicon substrate 132 that is enhanced to include standard clock resources on the substrate 132. Additional circuitry is added to the substrate 132 to effect customization of the clock resources in a context of the standardized silicon platform design process.

In FIG. 2A, a wafer 130 which uses standardized silicon platform technology is illustrated to include a large number of partially completed standardized silicon platform integrated circuits 132 arranged in a rectangular grid pattern on the wafer 130. In FIG. 2B, one of the partially completed standardized silicon platform integrated circuits 132 shown in FIG. 2A is enlarged to better show detailed features. The standardized silicon platform integrated circuit 132 includes slices 136, 142, 146 and clock resources including clock factories 138, 140, oscillator source 144 and reset source 148. The clock factories 138, 140 can be implemented using gate arrays or standard cells.

Each slice 136, 142, 146 comprises VLSI circuitry designed to perform a particular set of high level circuit functions. The pattern of slices and clock resources on each individual standardized silicon platform integrated circuit 132 is standardized for use in a particular marketing niche. Standardized silicon platform wafers 130 can be inventoried by the integrated circuit manufacturer for later use, if desired, to reduce time-to-market in customizing the standardized silicon platform wafer 130 in later processing steps which comprise adding customized layers of interconnections. Each standardized silicon platform integrated circuit 132 is, however, only partially completed and does not include at least some interconnection layers that provide the customizing for a particular customer application. A standard design for the interconnection layers of each slice exists as a design stored in a computer, however, and is available to a customer as a design starting point for customizing.

A customer (user) may wish to customize the operation of a particular slice to meet a particular industry standard such as a communication protocol. A customer may also wish to customize a slice in order to provide a new product feature that differentiates the customer's product from competitor's products. A customer may also wish to customize a particular slice to meet other performance goals. Since the slice does not include all interconnection layers, the slice is not "hard wired" and interconnection patterns can be developed later and then applied to customize the slice. This customization can be done even though the standardized silicon platform wafer 130 is standardized.

Using the integrated circuit manufacturer's specified software design tools, the customer customizes the function of individual slices and also customized the design of interconnections between the slices. This customization is then implemented by generation of interconnection layer designs. At a later processing step, the standardized silicon platform wafer 130 will be diced to separate each integrated circuit 132 into an integrated circuit chip.

In FIG. 2C, a portion 134 of the standardized silicon platform integrated circuit 132 is illustrated to show exemplary details. In FIG. 2C, the substrate 132 has a substrate surface 150 that includes an array of unconnected transistors 152 that surround islands 154, 156. The islands 154, 156 include circuit elements such as transistors 158, 160 that are interconnectable within each island to form a plurality of varied circuit functions for each of the islands 154. The varied circuit functions including both application functions and clock functions. As illustrated, islands 154, 156 form flip-flop functions.

A plurality of second interconnect layers 162, 164, 166, 168, 170 are deposited over the substrate surface 150. The second interconnect layers 162, 164, 166, 168, 170 interconnect the circuit elements (such as transistors 158, 160) within each island 154, 156 to complete the plurality of varied circuit functions. The varied circuit functions including varied levels of integration including at least gates, flip-flops, clock trees, and oscillators that are custom connectable to the array of unconnected transistors 152 to form standard clock resources for the standardized silicon platform integrated circuit 132. It will be understood by those skilled in the art that the interconnect layers are illustrated only schematically, and that actual interconnect layers are much more complex.

The particular application functions on the standardized silicon platform integrated circuit 132 are preferably selected to fill needs in a selected application niche. In a preferred arrangement, at least some of the varied circuit functions are connectable as both clock functions and application functions, depending on the needs for customization. The clock functions are preferably arranged to be connectable to form multiphase clock generators that generate a plurality of synchronous clock outputs with a closed timing specification. The array of unconnected transistors 152 preferably comprise N channel and P channel field effect transistors as illustrated. When the custom interconnection layers are added, some of the unconnected transistors 152 are connected by the custom interconnections to perform circuit functions.

The pattern of interconnections that is designed by the customer customizes the function of one or more slices and also customizes the clock resources. The pattern of interconnections also customizes the interconnections between the slices, the clock resources and bonding pads (not illustrated). The design process for the customized interconnections 162, 164, 166, 168, 170 illustrated in FIG. 2C is described below in connection with FIG. 3. In a preferred arrangement, the customized interconnections are metallization layers. In particular, the process of including custom clock functions is described in FIG. 3.

Figure 3:
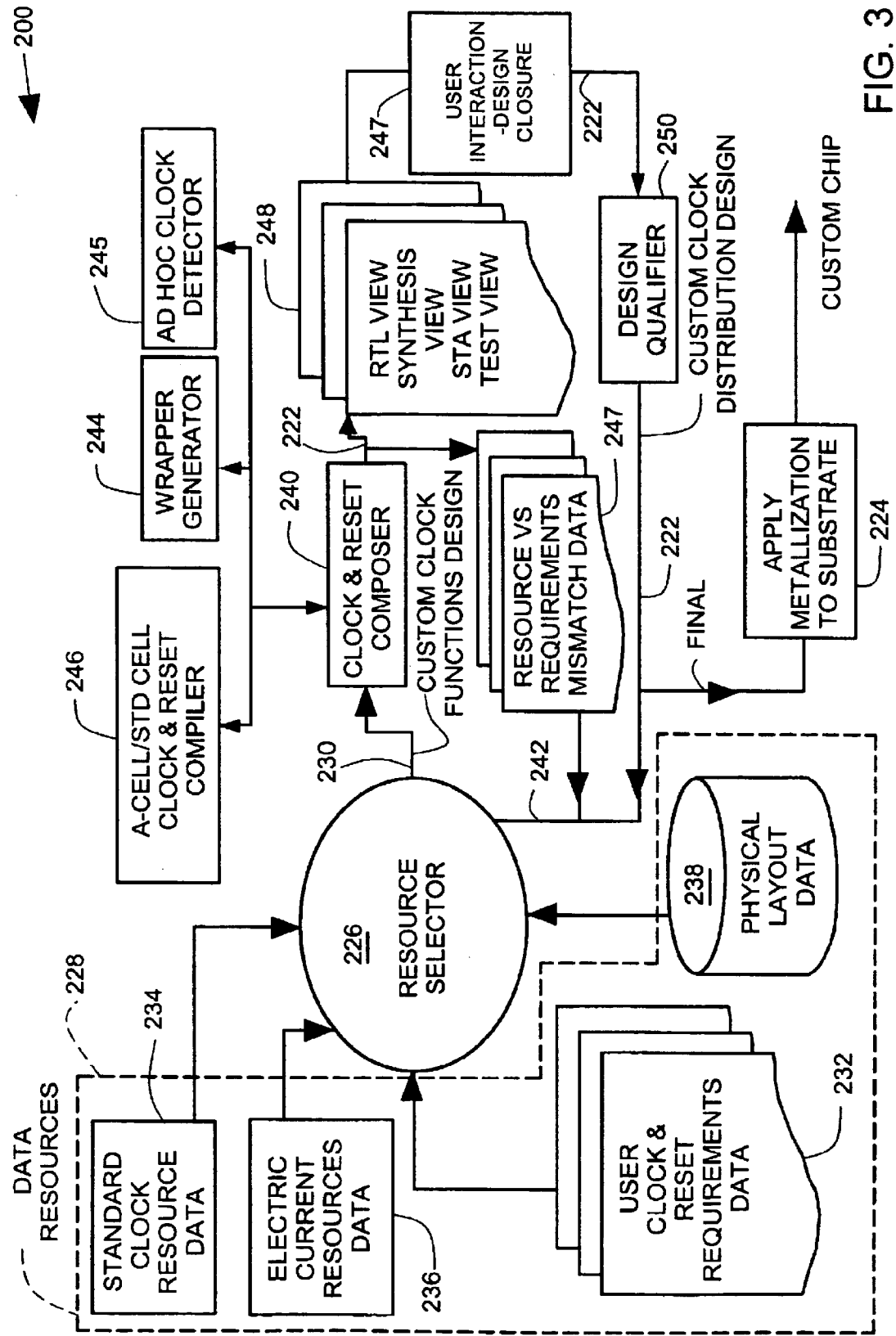
FIG. 3 illustrates a design tool and manufacturing process for producing a customized design for a standardized silicon platform chip.

FIG. 3 illustrates a software tool 200 and a manufacturing process 224 for preparing standardized silicon platform integrated circuit chips that include customizable clock functions. The software tool 200 is preferably implemented as a computer readable medium having computer executable instructions for performing a custom integrated circuit design. The software tool is typically downloaded from a manufacturer's website to a user computer for execution by the user computer. As part of a standardized silicon platform design method, a standardized silicon platform wafer with standardized silicon platform integrated circuit substrates (such as wafer 130 of FIG. 2A) is formed. Each standardized silicon platform integrated circuit substrate (such as substrate 132 in FIG. 2B) comprises a plurality of standard slices (such as slices 136, 142, 146 in FIG. 2B) to form a standard slice substrate. Each integrated circuit substrate is also enhanced to include standard clock resources. The standard clock resources comprise standard oscillator sources, standard reset sources, and standard clock factories.

A software design tool 200 illustrated in FIG. 3 is used to generate a custom clock distribution design as an integral part of a global interconnection design for all functions on the custom integrated circuit chip. As a starting point, a plurality of standard slice interconnection designs (not illustrated) corresponding with the plurality of standard slices are preferably available to the user in data form (as design starting points) but are not implemented in interconnections on the standardized silicon platform integrated circuit substrates 132. Because of the wide variety of clock requirements, however, a standard clock interconnection design is typically not available as a starting point for the user. Custom clock functions are included in a custom chip as part of a standardized silicon platform design method through the use of the software design tool 200.

The software design tool 200 generates a custom interconnection design (as physically realized in interconnection layers 162, 164, 166, 168, 170 in FIG. 2C) that includes a final custom clock distribution design 222 for application to the standard substrate in the manufacturing process 224 which applies custom interconnection to the standard substrate. The custom interconnection design defines interconnects that connect the custom clock resources (138, 140, 144, 148 in FIG. 2B). The custom interconnection design forms custom clock functions and defines interconnects that connect the custom clock functions to the standard slices (136, 142, 146 in FIG. 2B).

In the manufacturing process 224, a plurality of interconnection layers (such as layers 162, 164, 166, 168, 170) are applied to the standard substrate (132 in FIG. 2A) according to the custom interconnection design to complete the custom chip with custom clock functions.

The software design tool 200 includes a resource selector 226. The resource selector 226 receives data resources 228 defining the standard substrate (134 in FIG. 2A) and user requirement for the custom chip. The resource selector 226 generates a design of the custom clock functions 230. The resource selector 226 examines the available resources and the customer requirements 232 and selects which device resources to use to compose a particular customer clock and reset requirement. The resource selector 226 passes this information to a composer 240 to generate the various clock and reset objects needed. The design 230 defines a circuit assembled from available clock resources at a boolean level. The design 230 does not necessarily completely define precisely which particular gate, counter or other clock resource is used and does not completely define interconnection patterns.

The data resources 228 preferably comprise clock and reset requirements data 232 specified by the user, data on standard clock resources 234, including known good clock circuits) available on the standard substrate and associated with the development process, data on electrical current resources 236 available, and physical layout data 238 for the standard substrate. The clock and reset requirements data 232 can include clock and reset domains, clock characteristics (skew targets, margin, cycle time, insertion latency), insertion latency targets, power management requirements, cross clock domain coupling, MFG test source oscillators, LBIST groupings.

The clock and reset composer 240 is provided as part of the software design tool 200. The clock and reset composer 240 generates a custom clock distribution design 222 that defines the interconnects for the custom clock design. It will be understood that such definition of interconnects is preferably integrated into a definition of interconnects for the entire custom chip. The clock and reset composer 240 provides gross clock and reset design checking, comparisons between customer requirements and composed clock and reset performance. The clock and reset composer also provides calculations of insertion delays from physical placement information, clock skew estimations based on physical placement information, and requirements vs. selected options sanity checking. Other features include oscillator management, logical and physical clock and reset construction, clock and reset distribution control, fast clock and reset tuning, cross-domain clock tuning capability and integrated manufacturing tests.

The software design tool 200 generates iterative custom clock function designs 230 and iterative custom clock distribution designs 222 in which a present design iteration is a function of a previous design iteration. A previous design iteration is fed back along path 242 to the resource selector 226 in order that it can be used in a next design iteration.

A wrapper generator 244, a clock and reset compiler 246 and an ad hoc clock detector 245 preferably support the operation of the clock and reset composer 240. The ad hoc clock detector 245 provides a warning if the user has inadvertently included ad hoc clock circuitry in the design. If ad hoc clock circuitry is detected, it can be removed in a user interaction design closure function 247. The wrapper generator 244, based on the type of clock and reset pair being generated, creates the RTL and other structures required to provide the insertable clock and reset objects as requested by the clock and reset composer 240. The clock and reset composer 240 generates resource vs requirements mismatch data 247 and views 248 (RTL view, synthesis view, STA view, test view) of the custom clock distribution design 222. The custom clock distribution design 222 is preferably tested by design qualifier 250 as part of a process of determining whether additional design iterations are needed to converge on a final version of design 222.

The design tool 200 provides the ability to compose clocks and resets from a combination of diffused and gate array clocking resources. The design tool 200 preferably has the ability to correct by construction test insertion and the ability to quickly and easily balance across multiple clock domains without user intervention. Use of the design tool 200 allows for intelligent composing of clocks and resets which leads to higher density of functionality on the substrate. The design tool 200 provides performance feedback to the designer of the custom interconnection through the views 248, which reduces costly redesign late in the design cycle. The design tool preferably provides clock and reset structures that are known to be able to be processed through a bounded set of limits in the design system.

Figure 4:
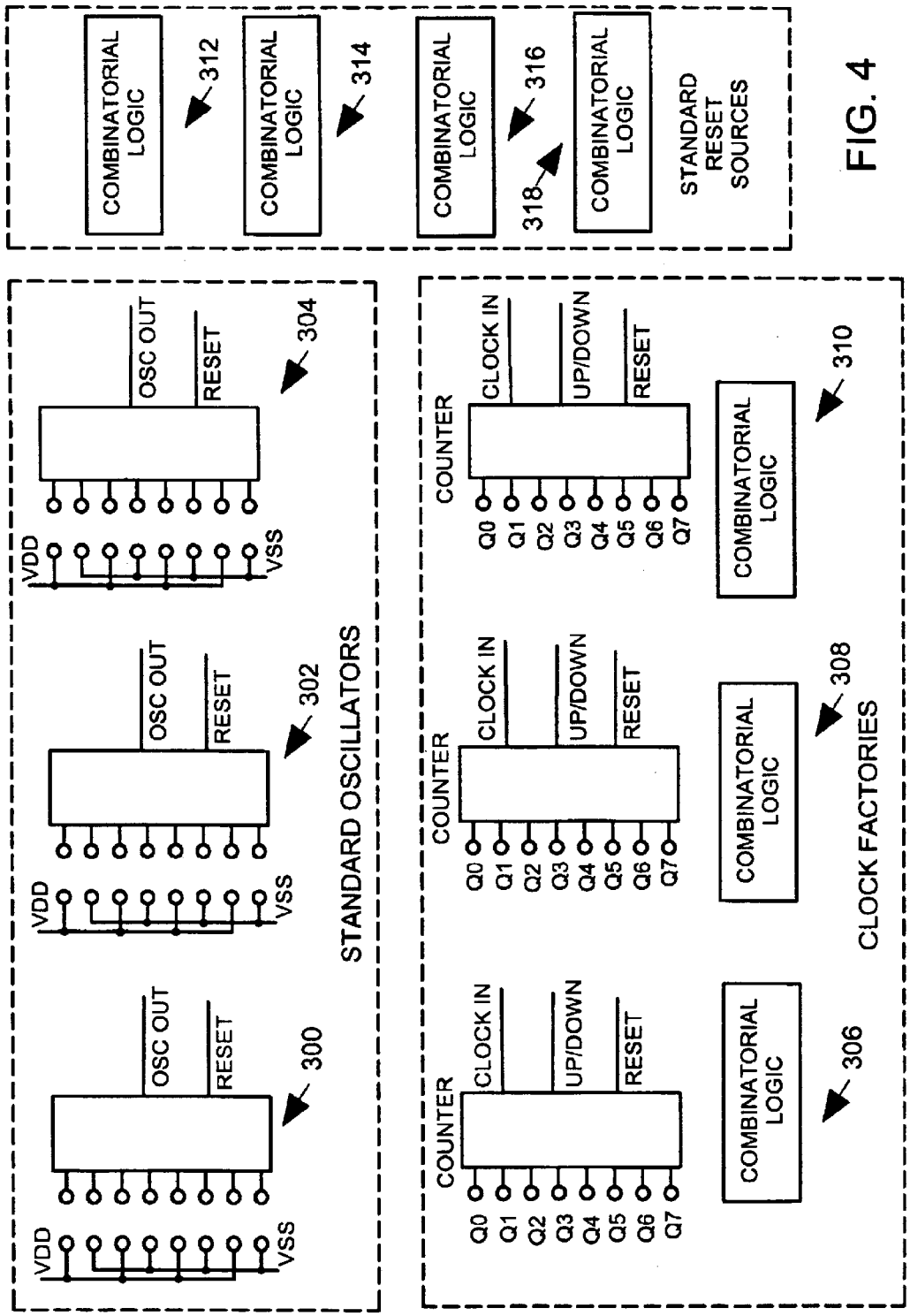
FIG. 4 schematically illustrates clock resources for a standardized silicon platform chip.

FIG. 4 schematically illustrates clock resources for a standardized silicon platform chip. In FIG. 4, the clock resources include standard oscillators 300, 302, 304, standard clock factories 306, 308, 310 and standard reset sources 312, 314, 316, 318. As illustrated in FIG. 4 the various resources are formed on the substrate missing the logical interconnections needed to make the various resources function. The various resources form a kit of standard components from which a complex clock circuit can be designed simply by design of a custom interconnection pattern. These interconnections are provided in a later manufacturing step in the form of a custom pattern of interconnections.

Each of the standard oscillators 300, 302, 304 has input nodes that can be connected by the interconnections to either VDD or VSS to set a custom frequency. Each of the standard oscillators provides an oscillator output and has an oscillator reset input. The standard oscillator sources illustrated are examples, and other types of oscillators, such as phase lock loop oscillators can also be used as standard oscillator sources. Much larger numbers of standard oscillator sources can be used. The standard oscillator sources can include feature such as reference clock I/O, PLL's, gate arrays, DLLs and pre-partially integrated IP.

Each of the standard clock factories 306, 308, 310 includes a counter that has a clock input, a reset input, an up/down input and outputs Q0–Q7. Each clock factory 306, 308, 310 also has clocking constraints and decoding of the counter output. Much larger numbers of clock factories can be used. Fully formed clock and reset factory outputs can be distributed their destinations on the slices with the interconnections.

Each of the standard reset resources 312, 314, 316, 318 includes a large array of combinatorial logic (gates, flip flops, multiplexers, etc.) that can be connected to define complex reset conditions for resets to the standard oscillators and standard clock factories. Standard reset resources can include Reset I/O, reset registers and reset counters.

In a preferred embodiment, known good clock circuits are interconnected from the circuit elements on the islands and the array of unconnected transistors. The known good clock circuits are selected from a group of clock functions that are known to facilitate manufacturing test, timing closure, clocking functionality and other factors that impact time to complete a detailed design and manufacture of a standardized silicon platform integrated circuit.

Standardized silicon platform design technology is enhanced to include a standard integrated circuit substrate with clock resources such as standard clock factories, standard oscillator sources and standard reset sources. Using a software design tool, the user can define interconnection patterns that customize the clock resources to adapt them to the needs of a custom chip design. The use of complex, time consuming, risky add-ons of "ad hoc" circuitry is avoided.

The software design tool is able to compose clocks and resets from a combination of diffused and gate array clocking resources. The software design tool is able to make corrections by construction test inserts, and is able to quickly balance across multiple clock domains. A highly flexible yet physically realizable set of clock and reset combinations is made available to the user. Clocks and resets are efficiently composed to conserve silicon real estate. An early view of the achievable clocking constructs and performance based on actual physical information is made available.

Although the present invention has been described with reference to preferred embodiments, workers skilled in the art will recognize that changes may be made in form and detail without departing from the scope of the invention.

What is claimed is:

1. A standardized silicon platform chip, comprising:
    a substrate having a substrate surface that includes an array of unconnected transistors that surround a plurality of islands; the plurality of islands including circuit elements that are interconnectable within each island to form a plurality of varied circuit functions for each of the islands; the varied circuit functions including both application functions and clock functions;
    a plurality of interconnect layers deposited over the substrate surface, the interconnect layers interconnecting the circuit elements within each island to complete the plurality of varied circuit functions; and
    the varied circuit functions including varied levels of integration including at least gates, flip-flops, clock trees, and oscillators that are custom connectable to the array of unconnected transistors to form standard clock resources for the standardized silicon platform integrated circuit.

2. The standardized silicon platform chip of claim 1 wherein the application functions are selected to fill needs in a selected application niche.

3. The standardized silicon platform chip of claim 1 wherein at least some of the varied circuit functions are connectable as both clock functions and application functions.

4. The standardized silicon platform chip of claim 1 wherein the clock functions are connectable to form multiphase clock generators.

5. The standardized silicon platform chip of claim 4 wherein the multiphase clock generators are connectable to generate a plurality of synchronous clock outputs.

6. The standardized silicon platform chip of claim 5 wherein the synchronous clock outputs have a closed timing specification.

7. The standardized silicon platform chip of claim 1 wherein the array of unconnected transistors comprise N channel field effect transistors.

8. The standardized silicon platform chip of claim 1 wherein the array of unconnected transistors comprise P channel field effect transistors.

9. A standardized silicon platform chip including the standardized silicon platform chip of claim 1 and further comprising:
a second plurality of interconnects deposited over the substrate surface and selectively interconnecting a selected subset of the islands with selected subset of the array of unconnected transistors to complete a selected customized clock function.

10. The standardized silicon platform chip of claim 9 wherein the second plurality of interconnects also complete a selected application function supported by the selected clock function.

11. The standardized silicon platform chip of claim 10 wherein the selected application function is in a selected application niche.

12. The standardized silicon platform chip of claim 9 wherein the second plurality of interconnects connects the clock resource to form a multiphase clock generator.

13. The standardized silicon platform chip of claim 12 wherein the multiphase clock generator generates a plurality of synchronous clock outputs.

14. The standardized silicon platform chip of claim 13 wherein the synchronous clock outputs have a closed timing specification.

15. A computer-readable medium having computer-executable instructions for performing a custom interconnect design for a standardized silicon platform chip, comprising:
standard clock resource data stored on the computer-readable medium;
physical layout data stored on the computer-readable medium;
instructions for prompting custom clock requirements from a user and for storing the custom clock requirements on the computer readable medium;
a composing program for composing a clock circuit for the standardized silicon platform chip and providing a clock design output;
a resource selector program for selectively applying the standard clock resource data, the physical layout data and custom clock requirements to the composing program;
a view generator program that generates a plurality of views of the clock design output;
a user interaction program that displays problems with the views of the clock design output and potential solutions to the problems to the user for selection and implementation to provide a closed design; and
a design qualify program that tests the closed design for errors and stores the closed design on the computer-readable medium if it is free of errors.

16. The computer-readable medium of claim 15, further comprising:
an ad-hoc clock detector program that interacts with the composing program to identify instances of ad-hoc clocking circuitry in the custom silicon platform chip design.

17. The computer-readable medium of claim 15, further comprising:
a clock compiler program interacting with the composing program to provide compiled clock designs to the composing programs.

18. The computer-readable medium of claim 15, wherein the closed design is applied to a standardized silicon platform chip that includes islands with interconnections that provide varied circuit functions surrounded by an array of unconnected transistors, and the closed design applies second interconnections that connect selected islands to selected unconnected transistors to customize the standardized silicon platform chip.

* * * * *